US009466685B2

(12) United States Patent
Moll et al.

(10) Patent No.: US 9,466,685 B2
(45) Date of Patent: Oct. 11, 2016

(54) SEMICONDUCTOR STRUCTURE INCLUDING AT LEAST ONE ELECTRICALLY CONDUCTIVE PILLAR, SEMICONDUCTOR STRUCTURE INCLUDING A CONTACT CONTACTING AN OUTER LAYER OF AN ELECTRICALLY CONDUCTIVE STRUCTURE AND METHOD FOR THE FORMATION THEREOF

(71) Applicant: GLOBALFOUNDRIES Inc., Grand Cayman (KY)

(72) Inventors: Hans-Peter Moll, Dresden (DE); Peter Baars, Dresden (DE); Thorsten Kammler, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/628,947

(22) Filed: Feb. 23, 2015

(65) Prior Publication Data

US 2016/0247891 A1    Aug. 25, 2016

(51) Int. Cl.
| H01L 29/78 | (2006.01) |
| H01L 29/49 | (2006.01) |
| H01L 27/092 | (2006.01) |
| H01L 23/535 | (2006.01) |
| H01L 21/8238 | (2006.01) |

(52) U.S. Cl.
CPC ... *H01L 29/4958* (2013.01); *H01L 21/823842* (2013.01); *H01L 23/535* (2013.01); *H01L 27/092* (2013.01)

(58) Field of Classification Search
CPC ............. H01L 29/4958; H01L 27/092; H01L 23/535; H01L 21/823842
See application file for complete search history.

(56) References Cited

U.S. PATENT DOCUMENTS

| 6,821,887 B2 | 11/2004 | Wieczorek et al. |
| 2004/0251549 A1 | 12/2004 | Huang et al. |
| 2008/0079090 A1 | 4/2008 | Hwang et al. |
| 2009/0026574 A1 | 1/2009 | Kim et al. |
| 2009/0117274 A1 | 5/2009 | Ma et al. |
| 2010/0301417 A1 | 12/2010 | Cheng et al. |
| 2011/0057267 A1 | 3/2011 | Chuang et al. |
| 2012/0187528 A1 | 7/2012 | Cheng et al. |

(Continued)

OTHER PUBLICATIONS

Office Action from related U.S. Appl. No. 14/136,815 dated Feb. 6, 2015.

(Continued)

*Primary Examiner* — Long Pham
(74) *Attorney, Agent, or Firm* — Amerson Law Firm, PLLC

(57) ABSTRACT

A semiconductor structure includes a substrate, at least one electrically conductive pillar provided over the substrate and an electrically conductive structure provided over the substrate. The electrically conductive pillar includes an inner portion and an outer layer that is provided below the inner portion and lateral to the inner portion. The electrically conductive structure also includes an inner portion and an outer layer that is provided below the inner portion and lateral to the inner portion. The electrically conductive structure annularly encloses each of the at least one electrically conductive pillar. The outer layer of each of the at least one electrically conductive pillar contacts the outer layer of the electrically conductive structure. The outer layer of the at least one electrically conductive pillar and the outer layer of the electrically conductive structure are formed of different metallic materials.

20 Claims, 10 Drawing Sheets

(56) References Cited

U.S. PATENT DOCUMENTS

2012/0217589 A1 8/2012 Yin et al.
2015/0211126 A1 7/2015 Ma

OTHER PUBLICATIONS

Final Office Action from related U.S. Appl. No. 14/136,815 dated Aug. 17, 2015.
Office Action from related U.S. Appl. No. 14/136,815 dated Feb. 22, 2016.
Office Action from related U.S. Appl. No. 14/136,581 dated Feb. 20, 2015.
Final Office Action from related U.S. Appl. No. 14/136,581 dated Aug. 17, 2015.
Office Action from related U.S. Appl. No. 14/136,581 dated Feb. 19, 2016.
Final Office Action from related U.S. Appl. No. 14/136,581 dated Jun. 17, 2016.

SEMICONDUCTOR STRUCTURE INCLUDING AT LEAST ONE ELECTRICALLY CONDUCTIVE PILLAR, SEMICONDUCTOR STRUCTURE INCLUDING A CONTACT CONTACTING AN OUTER LAYER OF AN ELECTRICALLY CONDUCTIVE STRUCTURE AND METHOD FOR THE FORMATION THEREOF

BACKGROUND OF THE INVENTION

1. Field of the Invention

Generally, the present disclosure relates to integrated circuits and methods for the manufacturing thereof, and, in particular, to integrated circuits including field effect transistors having gate electrodes including aluminum.

2. Description of the Related Art

Integrated circuits typically include a large number of circuit elements which include field effect transistors and, optionally, other circuit elements such as capacitors, inductivities, diodes and resistors. The circuit elements in an integrated circuit may be electrically connected by means of electrically conductive metal lines formed in a dielectric material. The electrically conductive metal lines may be provided in a plurality of interconnect layers, and they may be connected to the circuit elements and to each other by means of contact holes and contact vias that are filled with metal.

Field effect transistors include an active region formed in a semiconductor material such as, for example, silicon. The active region includes a source region, a drain region and a channel region between the source region and the drain region, wherein a doping of the channel region is different from a doping of the source region and the drain region. Above the channel region, a gate electrode that may be separated from the channel region by a gate insulation layer may be provided. For increasing the capacity between the gate electrode and the channel region, high-k materials having a greater dielectric constant than silicon dioxide may be used for forming the gate insulation layer.

Furthermore, gate electrodes including one or more metals may be employed. The gate electrodes may include a workfunction adjustment layer over the gate insulation layer. A material of the workfunction adjustment layer may be adapted such that a workfunction of the gate electrode and a workfunction of the active region match. For N-channel transistors and P-channel transistors, different workfunction adjustment layers may be employed.

For forming field effect transistors including a gate insulation layer including a high-k material and a metal gate electrode, replacement gate techniques may be employed. In replacement gate techniques, dummy gate structures are formed over the channel regions of the field effect transistors. Adjacent the dummy gate structures, sidewall spacer structures may be provided, and ion implantation processes may be performed in the presence of the dummy gate structures and/or the sidewall spacer structures for forming source and drain regions. Additionally, an interlayer dielectric material may be deposited over the semiconductor structure.

Thereafter, a chemical mechanical polishing process may be performed for exposing the dummy gate structures. Then, the dummy gate structures of field effect transistors of a first type, for example the dummy gate structures of P-channel field effect transistors, may be removed, and materials of an optional replacement gate insulation layer, a workfunction adjustment layer and a gate electrode material may be deposited.

Thereafter, a chemical mechanical polishing process may be performed, and the dummy gate structures of the field effect transistors of the other type, for example the N-channel field effect transistors, may be removed. Then, layers of materials of an optional replacement gate insulation layer, the workfunction adjustment layer of the N-channel transistors and the gate electrode material may be deposited, and a chemical mechanical polishing process may be performed.

In the chemical mechanical polishing processes that are performed after the deposition of the materials of the gate insulation layers, the workfunction adjustment layers and the gate electrode material, portions of the deposited materials outside the recesses formed by the removal of the dummy gate structures are removed for forming replacement gate structures from portions of the deposited layers in the recesses.

Thereafter, a further layer of an interlayer dielectric may be deposited over the semiconductor structure, and contact holes may be formed therein. This may be done by means of techniques of photolithography and etching. The contact holes may include contact holes over the gate electrodes of the field effect transistors as well as contact holes over the source regions and the drain regions of the transistors. The contact holes may be filled with an electrically conductive material such as, for example, tungsten, for providing electrical contacts to the field effect transistors.

Using aluminum as the gate electrode material that is deposited over the workfunction adjustment layers of the transistors may have the advantage of providing a high electrical conductivity as well as a high charge carrier density of the gate electrode. However, providing electrical contacts to the aluminum of the gate electrodes may have some issues associated therewith.

The aluminum of the gate electrodes may have a layer of aluminum oxide on top of the aluminum. For providing an electrical connection to the aluminum, it is desirable to etch through the electrically insulating aluminum oxide layer in the formation of contact holes and to stop the etch process in the aluminum without forming an interfacial layer. Additionally, in the etch process used for removing the interlayer dielectric, etch polymers may be formed. After the etch process, such etch polymers may need to be removed in a "soft" manner, i.e., without attacking the aluminum, and without forming an interfacial layer so that a proper electrical contact to the aluminum of the gate electrodes can be established. However, sputter processes and/or wet chemical cleaning processes employed for removing etch polymers may have issues associated therewith, which may include an insufficient removal of etch polymers or, in the case of more aggressive cleaning processes, the cleaning processes may attack the aluminum. This may lead to very narrow process windows for cleaning processes employed for the removal of etch polymers. Issues as described above may occur, in particular, in the case of relatively large gate electrodes, wherein contacts are in contact with only the aluminum portions of the gate electrodes.

In semiconductor structures wherein gate electrodes including aluminum are provided, aluminum may also be used for the formation of elements other than gate electrodes such as, for example, lithography overlay marks or portions of circuit elements such as capacitors or inductivities. However, in chemical mechanical polishing processes, a dishing of relatively large areas of a semiconductor structure including aluminum may occur. Therefore, the possibility to form relatively large features of aluminum may be limited.

In view of the above-described situation, the present disclosure provides semiconductor structures and methods that may help to provide a better electrical contact to electrically conductive structures such as, for example, gate electrodes including aluminum. Furthermore, the present disclosure provides semiconductor structures and methods that may help to reduce a dishing of relatively large electrically conductive structures including aluminum in chemical mechanical polishing processes.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure disclosed herein includes a substrate, at least one electrically conductive pillar provided over the substrate and an electrically conductive structure provided over the substrate. The electrically conductive pillar includes an inner portion and an outer layer that is provided below the inner portion and lateral to the inner portion. The electrically conductive structure also includes an inner portion and an outer layer that is provided below the inner portion and lateral to the inner portion. The electrically conductive structure annularly encloses each of the at least one electrically conductive pillar. The outer layer of each of the at least one electrically conductive pillar contacts the outer layer of the electrically conductive structure. The outer layer of the at least one electrically conductive pillar and the outer layer of the electrically conductive structure are formed of different metallic materials.

Another illustrative semiconductor structure disclosed herein includes a substrate, an electrically conductive structure provided over the substrate, an interlayer dielectric over the electrically conductive structure and a contact formed in the interlayer dielectric. The electrically conductive structure includes an inner portion and an outer layer that is provided below the inner portion and lateral to the inner portion. The contact provides an electrical connection to the electrically conductive structure. For any direction perpendicular to a thickness direction of the substrate, an extension of the first contact in the direction is smaller than a minimum extension of the electrically conductive structure in the direction. The contact is arranged such that the contact contacts the outer layer of the electrically conductive structure.

An illustrative method disclosed herein includes providing a semiconductor structure. The semiconductor structure includes a substrate, a dummy feature provided over the substrate and an electrically insulating structure that annularly encloses the dummy feature. A first portion of the dummy feature is removed. A second portion of the dummy feature adjacent the first portion remains in the semiconductor structure. The removal of the first portion of the dummy feature forms a first recess in the semiconductor structure. A first metallic layer and a first aluminum layer are deposited over the semiconductor structure. The first metallic layer covers bottom and sidewall surfaces of the first recess. Portions of the first metallic layer and the first aluminum layer outside the first recess are removed, wherein portions of the first metallic layer and the first aluminum layer in the first recess remain in the semiconductor structure. The second portion of the dummy feature is removed. The removal of the second portion of the dummy feature forms a second recess in the semiconductor structure. A second metallic layer including a different material than the first metallic layer and a second aluminum layer are deposited over the semiconductor structure. The second metallic layer covers bottom and sidewall surfaces of the second recess. Portions of the second metallic layer and the second aluminum layer outside the second recess are removed. Portions of the second metallic layer and the second aluminum layer in the second recess remain in the semiconductor structure. The portion of the first metallic layer remaining in the semiconductor structure contacts the portion of the second metallic layer remaining in the semiconductor structure.

BRIEF DESCRIPTION OF THE DRAWINGS

The disclosure may be understood by reference to the following description taken in conjunction with the accompanying drawings, in which like reference numerals identify like elements, and in which:

FIG. 1b shows a schematic top view of the semiconductor structure of FIG. 1a;

FIG. 4b shows a schematic top view of the semiconductor structure of FIG. 4a;

FIG. 4c shows a schematic cross-sectional view of another portion of the semiconductor structure shown in FIG. 4a;

FIG. 6b shows a schematic cross-sectional view of the semiconductor structure shown in FIG. 6a.

Figure 1A:
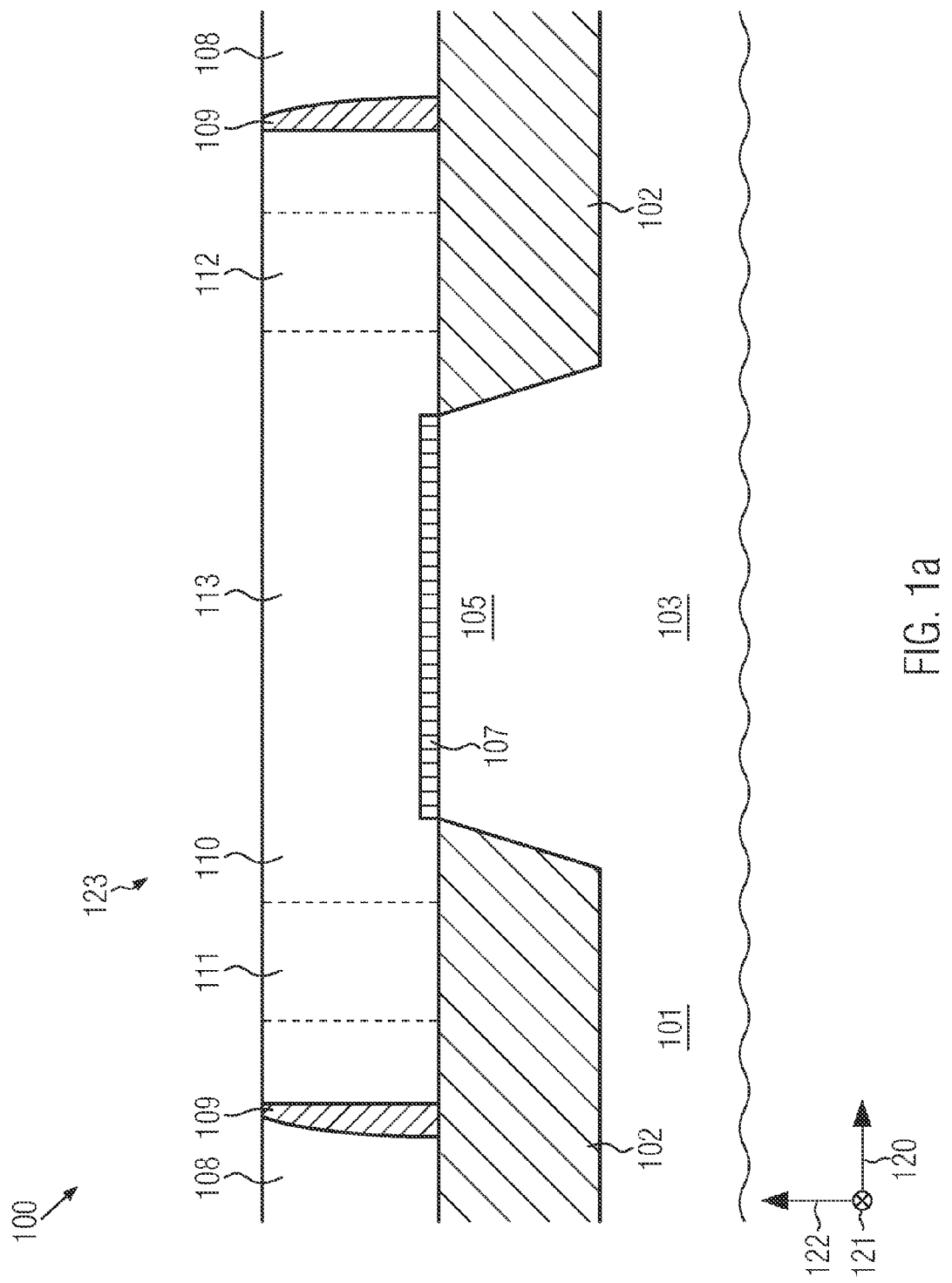
FIG. 1a shows a schematic cross-sectional view of a semiconductor structure according to an embodiment in a stage of a method according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Embodiments disclosed herein provide semiconductor structures and methods that may help to ensure that contacts to electrically conductive structures are always at least partly provided in contact with workfunction adjustment and/or barrier layers of the electrically conductive structure. The workfunction adjustment and/or barrier layers may be provided at edges or sidewalls of the electrically conductive structures. Such materials typically have a lower tendency to form oxides or other unwanted isolation layers. Thus, establishing a proper contact to these materials may be less challenging compared to aluminum.

In some embodiments, complementary electrically conductive metal gate pillars may be provided within relatively large electrically conductive structures including aluminum such as, for example, gate electrodes, photolithography overlay marks and/or portions of circuit elements of analog circuits. Such pillars may be formed in process sequences of a replacement gate process flow. The presence of the pillars may help to ensure a contact to workfunction adjustment and/or barrier layers even in the case of relatively wide electrically conductive structures. Thus, a more robust process window for electrical contacts such as contact holes filled with an electrically conductive material to the electrically conductive structures may be provided. In some embodiments, for providing the pillars, only a change in the layout for the masks employed in the replacement gate process flow may need to be performed so that no additional process complexity is involved.

In addition to improving electrical contacts to electrically conductive structures including aluminum, the presence of pillars having a workfunction adjustment and/or barrier material lateral thereof may help to reduce a dishing of large electrically conductive structures including aluminum in chemical mechanical polishing processes.

By providing electrically conductive pillars, portions of a metal other than aluminum sticking upwards may be provided within electrically conductive structures. Building metal pillar grids in large gate pads on shallow trench isolation structures may enable an extension of design rules to aluminum areas having a diameter greater than 2 μm and may allow larger electrically conductive structures including aluminum. This may be beneficial for building analog elements like capacitors or inductivities.

In other embodiments, electrical contacts to electrically conductive structures including aluminum may be provided closer to an edge and/or sidewall of the electrically conductive structure, or additional contacts may be provided in the vicinity of the edge and/or sidewall. In further embodiments, a gate edge may be shifted to a vicinity of a contact so as to enable a landing of the contact on a workfunction adjustment metal that is provided at the edge and/or sidewall of the gate electrode.

Metal pillars as disclosed herein may allow a safe landing of contacts to relatively large gate electrodes on workfunction adjustment materials, which may help to avoid aluminum oxide interface issues. Furthermore, electrically conductive pillars as disclosed herein may help to reduce a dishing in chemical mechanical polishing processes, which may help to improve a robustness of lithography overlay marks. Moreover, design rules may be extended so that metal pads substantially larger than 2 μm for extended analog elements like capacitors and/or inductivities are allowed. Since alternating patterning of complementary field effect transistors may be a part of a regular integration scheme, the formation of the electrically conductive pillars may be performed substantially without an additional complexity of the manufacturing process.

Figure 1B:
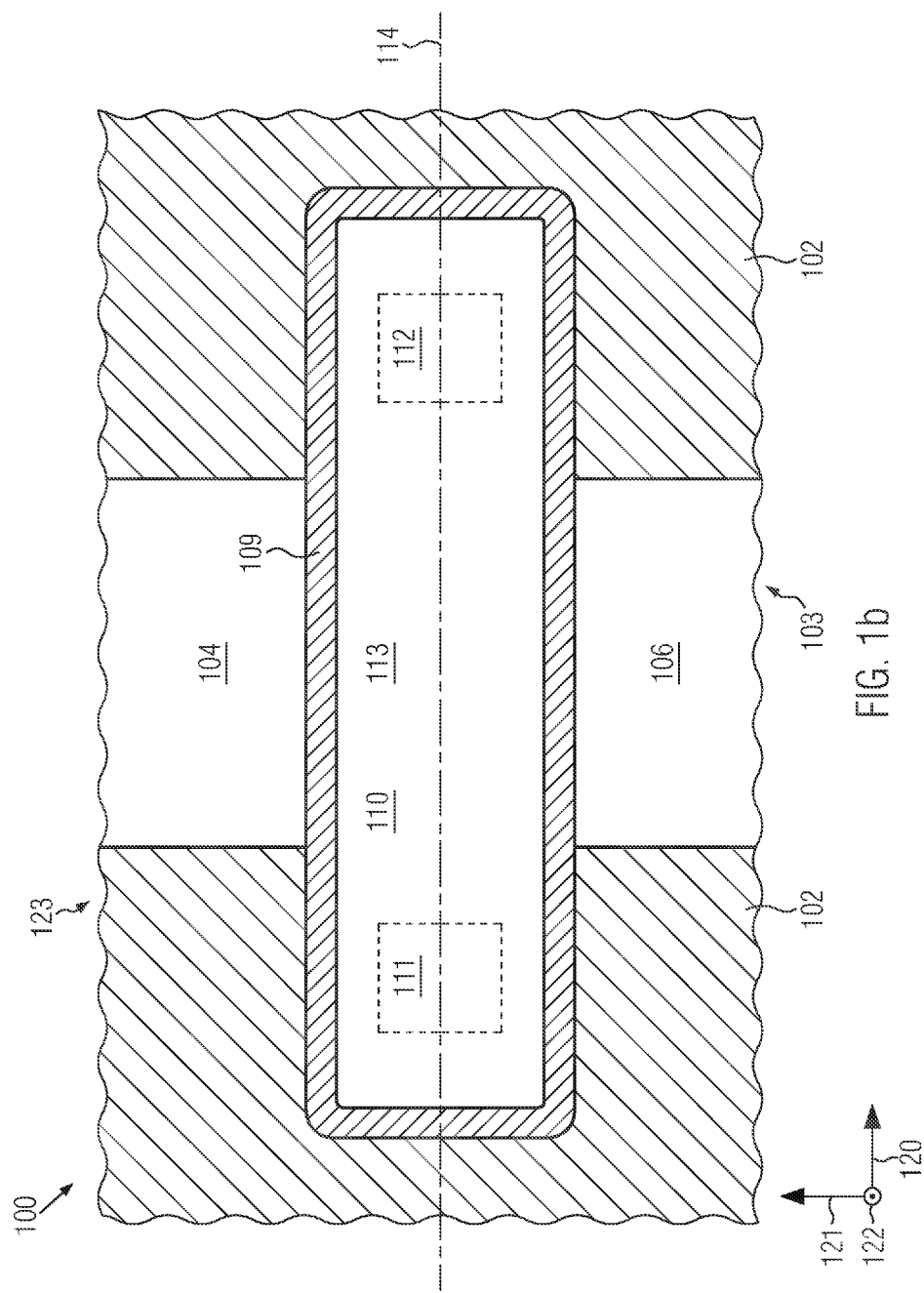

FIG. 1a shows a schematic cross-sectional view of a semiconductor structure 100 according to an embodiment in a stage of a method of manufacturing a semiconductor structure according to an embodiment. A schematic top view of the semiconductor structure 100 at the stage of the method illustrated in FIG. 1a is shown in FIG. 1b. In FIG. 1b, a dashed line 114 illustrates the location of the cross-section of FIG. 1a.

The semiconductor structure 100 includes a substrate 101. In some embodiments, the substrate 101 may be a bulk semiconductor substrate, for example a bulk silicon wafer. In other embodiments, the substrate 101 may be a semiconductor-on-insulator (SOI) substrate that includes a layer of a semiconductor material such as, for example, silicon that is provided on a layer of an electrically insulating material such as, for example, silicon dioxide. The layer of electrically insulating material may be provided on a support wafer, which may be a silicon wafer.

The substrate 101 may have a thickness direction, wherein an extension of the substrate 101 in the thickness direction is smaller than any extension of the substrate 101 in any direction that is other than the thickness direction. A surface of the substrate 101 at which circuit elements of the semiconductor structure 100 are formed may be substantially perpendicular to the thickness direction.

Reference numerals 120, 121, 122 denote axes of a coordinate system. In the view of FIG. 1a, coordinate axis 121 is pointing away from the viewer, as indicated by a circle with an "x" in the center. In the view of FIG. 1b, coordinate axis 122 is pointing towards the viewer, as indicated by a circle with a dot at the center. The thickness direction of the substrate 101 may substantially correspond to the direction of the coordinate axis 122, whereas coordinate axes 120, 121 are substantially perpendicular to the thickness direction.

In the substrate 101, an active region 103 of a field effect transistor element 123 may be provided. The active region 103 includes a source region 104, a channel region 105 and a drain region 106. In some embodiments, the transistor element 123 may be an N-channel transistor element, wherein the source region 104 and the drain region 106 are N-doped, and the channel region 105 is doped differently than the source region 104 and the drain region 106, for example P-doped or substantially undoped. In other embodiments, the transistor element may be a P-channel transistor, wherein the source region 104 and the drain region 106 are P-doped, and the channel region 105 is substantially undoped or N-doped. For convenience, in the following, description will be made of embodiments wherein the transistor element 123 is an N-channel transistor element.

A trench isolation structure 102 may provide electrical insulation between the active region 103 and other circuit elements in the semiconductor structure 100. The trench isolation structure 102 may be provided on two opposite sides of the active region 103. Additionally, the trench isolation structure 102 may include portions which, in the view of FIG. 1b, are above and below the active region 103 so that the trench isolation structure 102 annularly encloses the active region 103.

A channel length direction of the transistor element 123, which extends from the source region 104 to the drain region 106, may be substantially parallel to the direction of coordinate axis 121, and a channel width direction of the transistor element 123, which is substantially perpendicular to the channel length direction, may be substantially parallel to the coordinate axis 120.

The transistor element 123 may further include a dummy gate electrode 110. The dummy gate electrode 110 is provided above the channel region 105 and separated therefrom by a gate insulation layer 107.

The dummy gate electrode 110 is a dummy feature that will be replaced by a final gate electrode of the transistor element 123 in later stages of the method. The dummy gate electrode 110 may be formed of polycrystalline silicon or amorphous silicon.

The gate insulation layer 107 may be a final gate insulation layer that remains in the semiconductor structure 100. The gate insulation layer 107 may include a high-k material having a greater dielectric constant than silicon dioxide such as, for example, hafnium dioxide, zirconium dioxide and/or hafnium zirconium dioxide, optionally in addition to silicon dioxide.

Adjacent the dummy gate electrode 110, a sidewall spacer structure 109 may be provided. The semiconductor structure 100 may further include an interlayer dielectric 108 that is provided adjacent the sidewall spacer structure 109. The sidewall spacer structure 109 and the interlayer dielectric 108 may include different materials. For example, in some embodiments, the sidewall spacer structure 109 may include silicon nitride, and the interlayer dielectric 108 may include silicon dioxide. The sidewall spacer structure 109 and the interlayer dielectric 108 form an electrically insulating structure that annularly encloses the dummy gate electrode 110.

The dummy gate electrode 110 may include first portions 111, 112. The first portions 111, 112 may be located over the trench isolation structure 102. Additionally, the dummy gate electrode 110 may include a second portion 113, wherein a part of the second portion 113 is located over the channel region 105 of the transistor element 123, and the rest of the second portion 113 is located over the trench isolation structure 102. At the stage of the method illustrated in FIGS. 1a and 1b, there need not be a physical difference between the first portions 111, 112 of the dummy gate electrode 110 and the second portion 113 of the dummy gate electrode 110. However, the first portions 111, 112 and the second portion 113 of the dummy gate electrode 110 may be processed in a different manner in later stages of the method, as will be detailed below.

The second portion 113 of the dummy gate electrode 110 may annularly enclose each of the first portions 111, 112 of the dummy gate electrode 110, as shown in FIG. 1b.

The features of the semiconductor structure 100 shown in FIGS. 1a and 1b may be formed by means of known techniques for the manufacturing of semiconductor structures. In particular, the trench isolation structure 102 may be formed by means of techniques of photolithography, etching, oxidation, deposition and/or chemical mechanical polishing. For providing a doping of the channel region 105, an ion implantation process for introducing dopants into the semiconductor material of the substrate 101 may be performed before the formation of the gate insulation layer 107, the dummy gate electrode 110 and the sidewall spacer structure 109.

The gate insulation layer 107 and the dummy gate electrode 110 may be formed by depositing layers of the materials of the gate insulation layer 107 and the dummy gate electrode 110 over the semiconductor structure 100 and subsequently patterning these layers by means of processes of photolithography and etching. In embodiments wherein the gate insulation layer 107 includes silicon dioxide, the silicon dioxide may be formed by means of a thermal oxidation process. In embodiments wherein the gate insulation layer 107 includes a high-k material having a greater dielectric constant than silicon dioxide, a layer of the high-k material may be deposited by means of chemical vapor deposition, plasma-enhanced chemical vapor deposition and/or atomic layer deposition. A layer of the material of the dummy gate electrode 110 may be formed by depositing a layer of polysilicon or amorphous silicon over the semiconductor structure 100. This may be done by means of chemical vapor deposition or plasma-enhanced chemical vapor deposition.

The sidewall spacer structure 109 may be formed by substantially isotropically depositing one or more layers of one or more sidewall spacer materials over the semiconductor structure 100 after the patterning of the layers of the materials of the gate insulation layer 107 and the dummy gate electrode 110 and, after the deposition of each of the layers of sidewall spacer material, performing an anisotropic etch process for removing portions of the respective layer of sidewall spacer material over substantially horizontal portions of the semiconductor structure 100.

For doping the source region 104 and the drain region 106, one or more ion implantation processes may be performed, wherein an ion implantation may be performed both before the formation of the sidewall spacer structure 109 and after the formation of the sidewall spacer structure 109 for obtaining a desired dopant profile at the interfaces between the source and drain regions 104, 106 and the channel region 105.

Thereafter, a layer of the interlayer dielectric 108, for example a silicon dioxide layer, may be deposited over the semiconductor structure 100 by means of chemical vapor deposition or plasma-enhanced chemical vapor deposition, and a chemical mechanical polishing process may be performed for obtaining a substantially planar surface of the semiconductor structure 100 and for exposing the dummy gate electrode 110 at the surface of the semiconductor structure 100.

Figure 2:
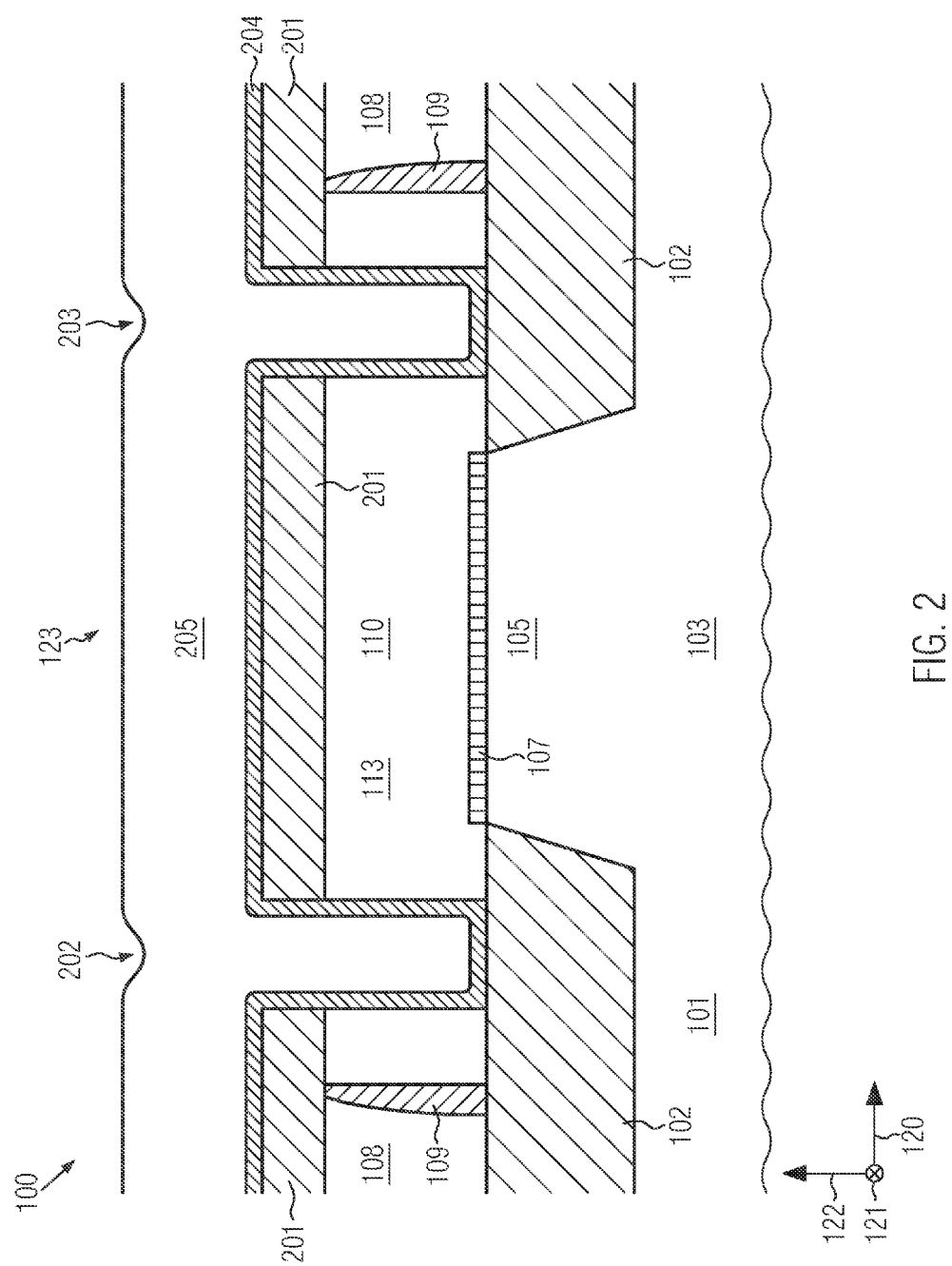
FIGS. 2, 3 and 4A show schematic cross-sectional views of the semiconductor structure shown in FIGS. 1a, 1b in later stages of the method.

FIG. 2 shows a schematic cross-sectional view of the semiconductor structure 100 in a later stage of the manufacturing process. A mask 201 may be formed over the semiconductor structure 100. The mask 201 may be a photoresist mask or a hardmask. In embodiments wherein the mask 201 is a photoresist mask, the mask 201 may be formed by means of a photolithography process. In embodiments wherein the mask 201 is a hardmask, the mask 201 may be formed by depositing a layer of a hardmask material such as, for example, silicon nitride over the semiconductor structure 100 and then patterning the layer of the hardmask material by means of photolithography and etching.

The mask 201 may cover the second portion 113 of the dummy gate electrode 110 but not the first portions 111, 112 of the dummy gate electrode 110 so that the first portions 111, 112 of the dummy gate electrode 110 are exposed at the surface of the semiconductor structure 100. Additionally, the mask 201 may cover the sidewall spacer structure 109 and the interlayer dielectric 108.

After the formation of the mask 201, an etch process adapted for removing the material of the dummy gate electrode 110 may be performed in the presence of the mask 201. The etch process may be a dry etch process. In the etch process, the first portions 111, 112 of the dummy gate electrode 110 may be removed so that a recess 202 is formed at the location of the first portion 111 of the dummy gate electrode 110, and a recess 203 is formed at the location of the first portion 112 of the dummy gate electrode 110. The etch process used for removing the first portions 111, 112 may have a relatively high degree of anisotropy so that relatively steep sidewalls of the recesses 202, 203 which are substantially parallel to the thickness direction 122 are obtained. At the bottom of the recesses 202, 203, portions of the trench isolation structure may can be exposed.

After the removal of the first portions 111, 112 of the dummy gate electrode 110, a first metallic layer 204 may be deposited over the semiconductor structure 100. The first metallic layer 204 may include a gate workfunction adjustment material for a transistor of a type that is opposite to the type of the transistor element 123. In embodiments wherein the transistor element 123 is an N-channel transistor element, the first metallic layer 204 may include a P-gate workfunction adjustment material for a P-channel transistor, for example tantalum nitride and/or titanium nitride. The first metallic layer 204 need not be a substantially homogeneous layer. In some embodiments, the first metallic layer 204 may include sublayers that are formed of different materials. For example, the first metallic layer 204 may include a first tantalum nitride sublayer, a titanium nitride sublayer and a second tantalum nitride sublayer, wherein the titanium nitride sublayer is arranged between the first and the second tantalum nitride sublayer. In other embodiments, the first metallic layer 204 may be substantially homogeneous. In further embodiments, the first metallic layer 204 may include metals that are different from those described above, wherein the first metallic layer 204 includes at least one material other than aluminum.

The first metallic layer 204 may cover the portions of the trench isolation structure 102 exposed at the bottom of the recesses 202, 203. Additionally, the first metallic layer 204 may cover sidewalls of the recesses 202, 203. As will be explained in more detail below, other portions of the first metallic layer 204, which are not shown in FIG. 2, may be provided over gate insulation layers of transistors of the type opposite to the type of the transistor element 123, for example P-channel transistors, and may be employed for adapting a workfunction of gate electrodes thereof. For depositing the first metallic layer 204, techniques of atomic layer deposition may be employed.

After the deposition of the first metallic layer 204 over the semiconductor structure 100, a first aluminum layer 205 may be deposited over the semiconductor structure 100. The first aluminum layer 205 may be formed by means of physical vapor deposition. A thickness of the first aluminum layer 205 may be adapted such that the recesses 202, 203 are substantially filled with aluminum up to their edges.

Figure 3:
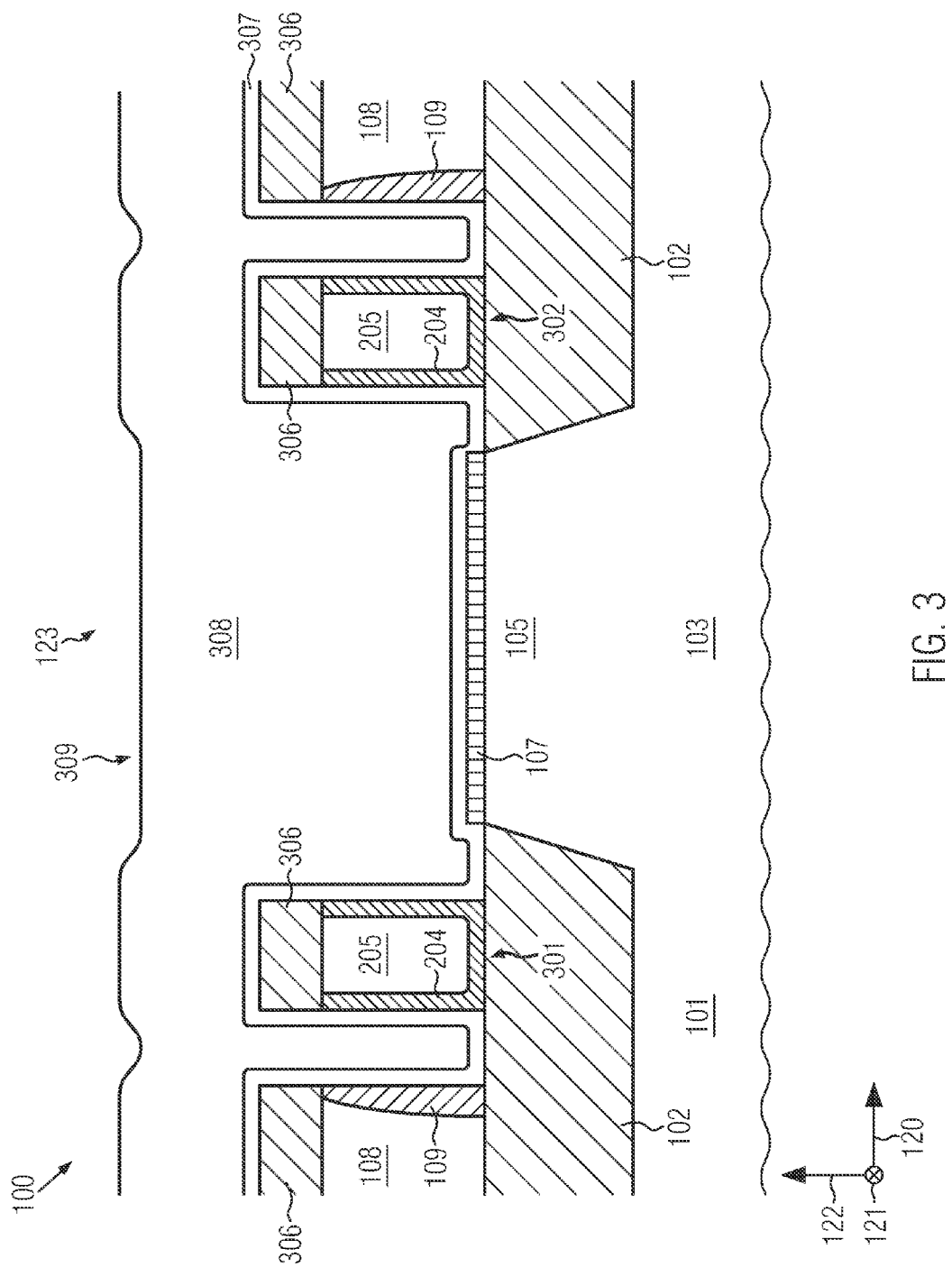

FIG. 3 shows a schematic cross-sectional view of the semiconductor structure 100 in a later stage of the manufacturing process. After the deposition of the first aluminum layer 205, a chemical mechanical polishing process may be performed. In the chemical mechanical polishing process, the mask 201, as well as portions of the first metallic layer 204 and the first aluminum layer 205 outside the recesses 202, 203 may be removed, and a substantially planar surface of the semiconductor structure 100 may be obtained. Portions of the first metallic layer 204 and the first aluminum layer 205 in the recesses 202, 203 remain in the semiconductor structure 100 and form a first electrically conductive pillar 301 and a second electrically conductive pillar 302. The electrically conductive pillars 301, 302 are provided at the locations of the first portions 111, 112 of the dummy gate electrode 110 on opposite sides of the active region 103 over the trench isolation structure 102.

The portion of the first aluminum layer 205 that was deposited in the recess 202 forms an inner portion of the electrically conductive pillar 301, and the portion of the first metallic layer 204 that was deposited in the recess 202 forms an outer layer of the electrically conductive pillar 301. The portion of the first metallic layer 204 that was deposited at the bottom of the recess 202 is arranged below the inner portion, and portions of the first metallic layer 204 that were deposited on the sidewalls of the recess 202 are provided lateral to the inner portion. Thus, the pillar 301 includes an inner portion including aluminum and an outer layer formed of the material of the first metallic layer 204 that is provided below the inner portion and lateral to the inner portion.

Similarly, the pillar 302 includes an inner portion formed from the portion of the first aluminum layer 205 that was deposited in the recess 203 and an outer layer formed from portions of the first metallic layer 204 deposited in the recess 203 that is provided below the inner portion and lateral to the inner portion.

Since the electrically conductive pillars 301, 302 are provided over the trench isolation structure 102, the portions of the first metallic layer 204 forming the outer layers of the pillars 301, 302 may be spaced apart from the gate insulation layer 107 and the channel region 105 so that they have substantially no influence on the channel region 105 of the transistor element 123 or only a small influence.

After the chemical mechanical polishing process, a mask 306 may be formed over the semiconductor structure 100. The mask 306 may cover the electrically conductive pillars 301, 302. Additionally, the mask 306 may cover portions of the electrically insulating structure provided by the sidewall spacer structure 109 and the interlayer dielectric 108 that annularly encloses the dummy gate electrode 110. However, the mask 306 does not cover the second portion 113 of the dummy gate electrode 110 that was not removed in the etch process performed for forming the recesses 202, 203. Thus, the second portion 113 of the dummy gate electrode 110 is exposed at the surface of the semiconductor structure 100. Similar to the mask 201 described above with reference to FIG. 2, the mask 306 may be a photoresist mask or a hardmask, and corresponding techniques may be employed for the formation thereof.

After the formation of the mask 306, an etch process adapted for removing the material of the dummy gate electrode 110 may be performed. Thus, the second portion 113 of the dummy gate electrode 110 may be removed from the semiconductor structure 100, and a recess 309 may be formed at the location of the second portion 113 of the dummy gate electrode 110, wherein the gate insulation layer 107 remains in the semiconductor structure 100. Thus, the gate insulation layer 107 is provided at the bottom of the recess 309.

Thereafter, a second metallic layer 307 may be deposited over the semiconductor structure 100. The second metallic layer 307 may include a gate workfunction adjustment material for the transistor element 123. In embodiments wherein the transistor element 123 is an N-channel transistor element, the second metallic layer 307 may include an N-gate workfunction adjustment material for an N-channel transistor. For example, the second metallic layer 307 may include lanthanum, lanthanum nitride and/or titanium nitride, wherein at least one material of the second metallic layer 307 is different from any of the materials of the first metallic layer 204. In some embodiments, the second metallic layer 307 may include a plurality of sublayers that are formed of different materials. For depositing the second metallic layer 307, techniques of atomic layer deposition may be employed.

After the deposition of the second metallic layer 307, a second aluminum layer 308 may be deposited over the semiconductor structure 100, for example by means of physical vapor deposition. A thickness of the second aluminum layer 308 may be adapted such that the recess 309 of the semiconductor structure 100 that was formed by removing the second portion 113 of the dummy gate electrode 110 is substantially filled to its edge with aluminum.

Figure 4A:
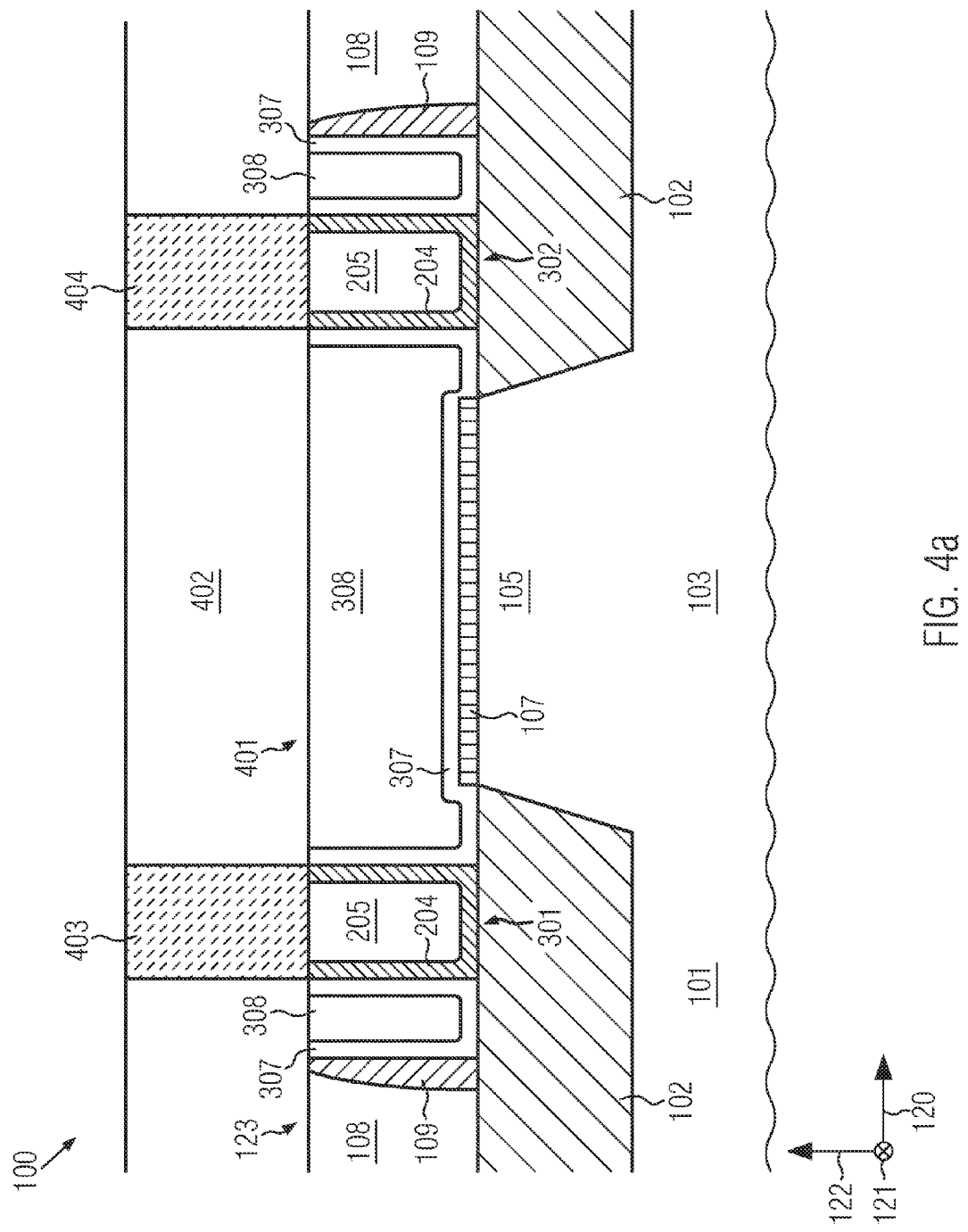

FIG. 4a shows a schematic cross-sectional view of the semiconductor structure 100 in a later stage of the manufacturing process. After the deposition of the second aluminum layer 308, a chemical mechanical polishing process may be performed for removing portions of the second metallic layer 307 and the second aluminum layer 308 outside the recess 309. Portions of the second metallic layer 307 and the second aluminum layer 308 in the recess 309 remain in the semiconductor structure 100 and form a replacement gate electrode 401 of the N-channel transistor element 123. The replacement gate electrode 401 forms an electrically conductive structure that includes an inner portion that is formed from the material of the second aluminum layer 308 and an outer layer formed from the second metallic layer 307. Portions of the second metallic layer 307 that were deposited on the gate insulation layer 107 or on the trench isolation structure 102 are arranged below the inner portion, and portions of the second metallic layer 307 that were deposited on sidewalls of the electrically conductive pillars 301, 302 or on the sidewall spacer structure 109 are arranged lateral to the inner portion. Thus, the replacement gate electrode 401 includes an inner region formed of the aluminum of the second aluminum layer 308 and an outer layer formed of the material of the second metallic layer 307, wherein the outer layer is provided below the inner portion and lateral to the inner portion. Portions of the outer layer of the replacement gate electrode 401 that were deposited on the sidewalls of the electrically conductive pillars 301, 302 contact the outer layers of the electrically conductive pillars 301, 302 that are provided by the portions of the first metallic layer 204 that were deposited on sidewalls of the recesses 202, 203.

The portion of the second metallic layer 307 that was deposited on the gate insulation layer 107 may interact with the channel region 105 so that it may have an influence on the threshold voltage of the transistor element 123.

Thereafter, an interlayer dielectric 402 may be deposited over the semiconductor structure 100. In some embodiments, the interlayer dielectric 402 may include silicon dioxide, and it may be formed by means of techniques of chemical vapor deposition and/or physical vapor deposition.

Thereafter, contact holes may be formed in the interlayer dielectric 402. This may be done by means of techniques of photolithography and etching. Then, the contact holes may be filled with an electrically conductive material, for example tungsten, for forming contacts 403, 404. Portions of the electrically conductive material outside the contact holes may be removed by means of a chemical mechanical polishing process.

The contact 403 may be provided over the electrically conductive pillar 301, and the contact 404 may be provided over the electrically conductive pillar 302. Dimensions of the contacts 403, 404 may be greater than dimensions of the inner portions of the electrically conductive pillars 301, 302 that are formed from the portions of the first aluminum layer 205 in the recesses 202, 203 so that the contacts 403, 404 are in contact with the outer layers of the electrically conductive pillars 301, 302 that are formed from the portions of the first metallic layer 204 in the recesses 202, 203. Additionally, the contacts 403, 404 may be in contact with the outer layer of the replacement gate electrode 401 formed from the second metallic layer 307. Thus, the contacts 403, 404 are in contact with at least one material different from aluminum.

Figure 4B:
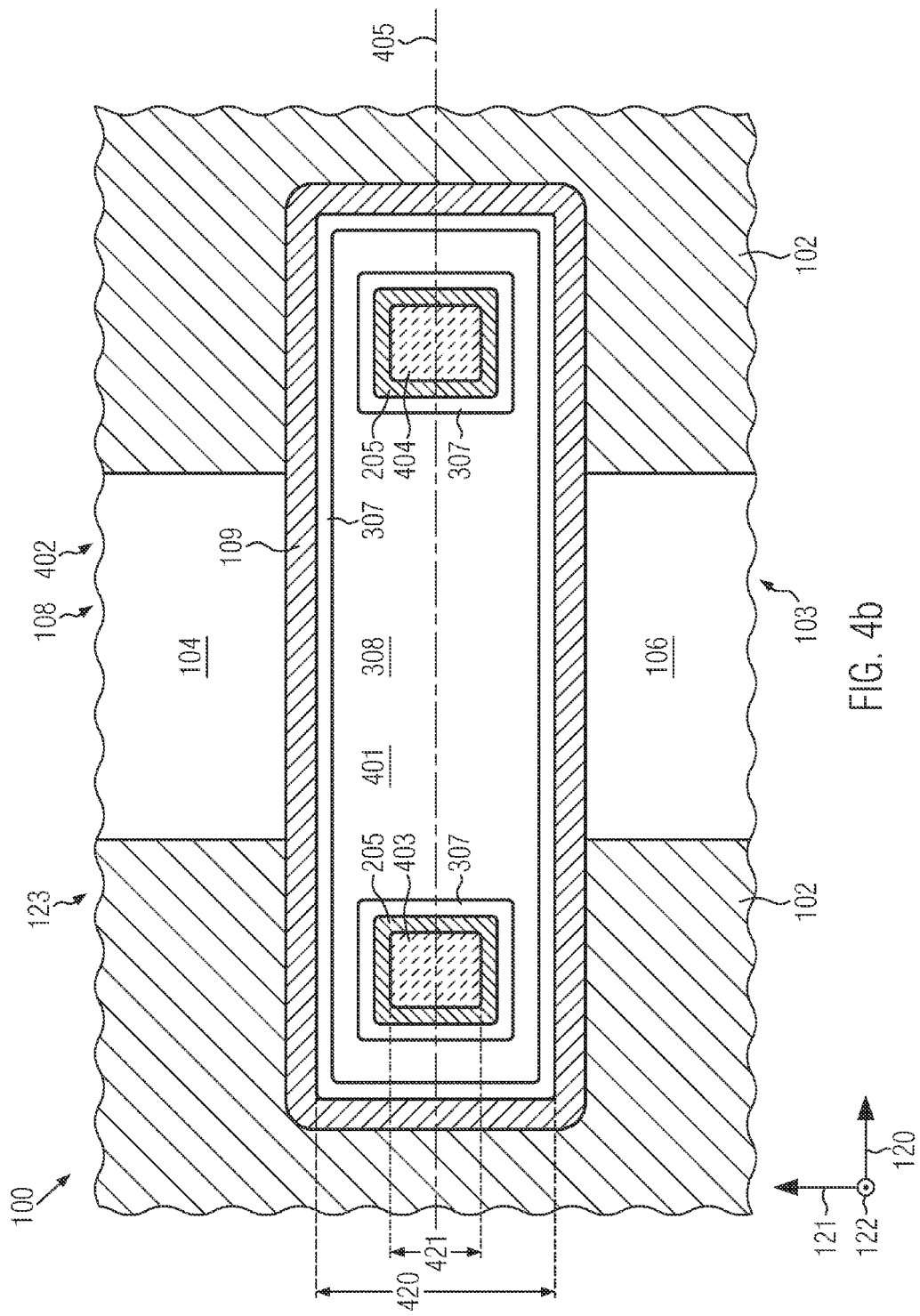

FIG. 4b shows a schematic top view of the semiconductor structure 100 at the stage of the method shown in FIG. 4a, wherein the interlayer dielectrics 108, 402 are shown transparently for illustrating the relative arrangements of the features. A dashed line 405 illustrates the location of the cross-section of FIG. 4a.

An extension 421 of the contact 403 in the direction of the coordinate axis 121, corresponding to the channel length direction of the transistor element 123, may be smaller than an extension 420 of the replacement gate electrode 401 in the channel length direction. Dimensions of the contact 404 may correspond to the dimensions of the contact 403.

The extension 420 of the replacement gate electrode 401 in the direction of the coordinate axis 121, corresponding to the channel length of the transistor element 123, may be in a range from about 25-900 nm and/or in a range from about 50-900 nm. Other transistor elements in the semiconductor structure 100 may have a smaller channel length that is approximately equal to or smaller than the extension 421 of contacts in the channel length direction. In such transistors, electrically conductive pillars below the contacts may be omitted, and the electrically conductive pillars 301, 302 may be provided only in transistor elements having a relatively large channel length such as, for example, input/output transistors.

Figure 4C:
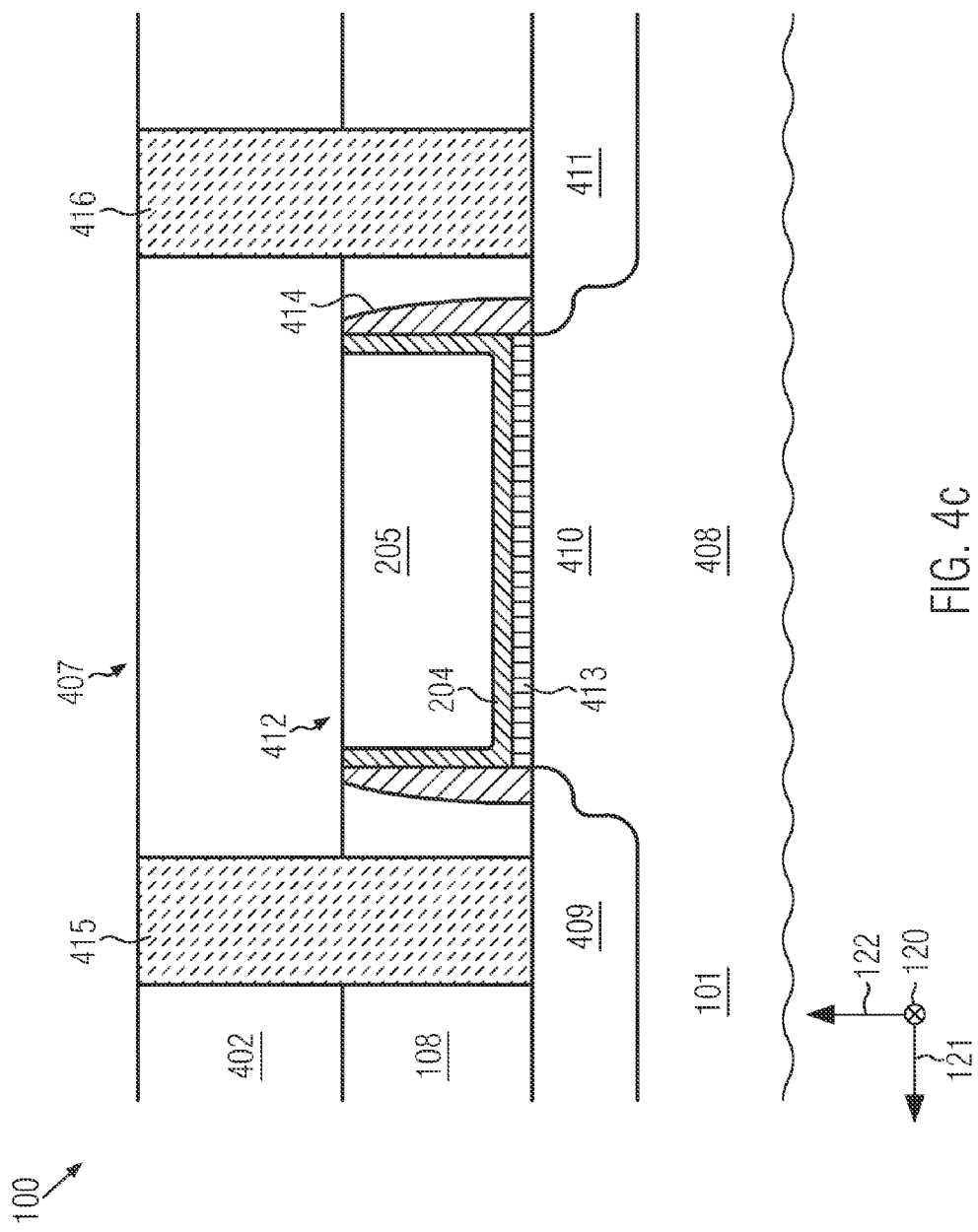

FIG. 4c shows a schematic cross-sectional view of a portion of the semiconductor structure 100 that is different from the portion shown in FIGS. 1a to 4b. In this portion of the semiconductor structure 100, a transistor element 407 of the type opposite to the type of the transistor element 123, for example a P-channel transistor element 407, is provided. The transistor element 407 includes a source region 409, a drain region 411 and a channel region 410 that is arranged between the source region 409 and the drain region 411. Over the channel region 410, a gate insulation layer 413, which may include materials corresponding to those of the gate insulation layer 107 of the transistor element 123, and a replacement gate electrode 412 are provided. Adjacent the replacement gate electrode 412, a sidewall spacer structure 414 and the interlayer dielectric 108 may be provided. Above the replacement gate electrode 412 and the interlayer dielectric 108, the interlayer dielectric 402 may be provided.

In the interlayer dielectrics 108, 402, contacts 415, 416, which may be formed by filling contact holes with an electrically conductive material, may be provided. The contacts 415, 416 may provide an electrical contact to the source region 409 and the drain region 411. Further contacts (not shown) may be provided for providing an electrical contact to the replacement gate electrode 412.

The replacement gate electrode 412 includes a workfunction adjustment layer that is provided in the form of a portion of the first metallic layer 204 and an aluminum portion that is provided by a portion of the first aluminum layer 205.

For forming the source region 409, the channel region 410 and the drain region 411, ion implantation processes may be employed that are different from the implantation processes employed for doping the source region 104, the channel region 105 and the drain region 106 of the transistor element 123. During the ion implantation processes used for doping the source region 104, the channel region 105 and the drain region 106 of the transistor element 123, the transistor element 407 may be covered by a mask, and the transistor element 123 may be covered by a mask during implantation processes that are performed for doping the source region 409, the channel region 410 and the drain region 411 of the transistor element 407.

Other features of the transistor element 407 may be formed in the same method steps wherein features of the transistor element 123 are formed. For example, the gate insulation layers 413, 107 may be formed from one layer of a gate insulation material, and the sidewall spacer structures 109, 414 may be formed from the same one or more layers of sidewall spacer materials and by means of the same one or more anisotropic etch processes. For forming the replacement gate structure 412, a dummy gate electrode (not shown) of the transistor element 407 may be removed in the same etch process as the first portions 111, 112 of the dummy gate electrode 110 of the transistor element 123 and, after the deposition of the first metallic layer 204 and the first aluminum layer 205, portions of these layers outside the recess formed by removing the dummy gate electrode of the transistor element 407 may be removed in the same chemical mechanical polishing process wherein the electrically conductive pillars 301, 302 are formed.

The contacts 415, 416 may be formed in the same method steps as the contacts 403, 404 and/or further contacts that provide an electrical contact to the source region 104 and the drain region 106 of the transistor element 123.

Figure 5:
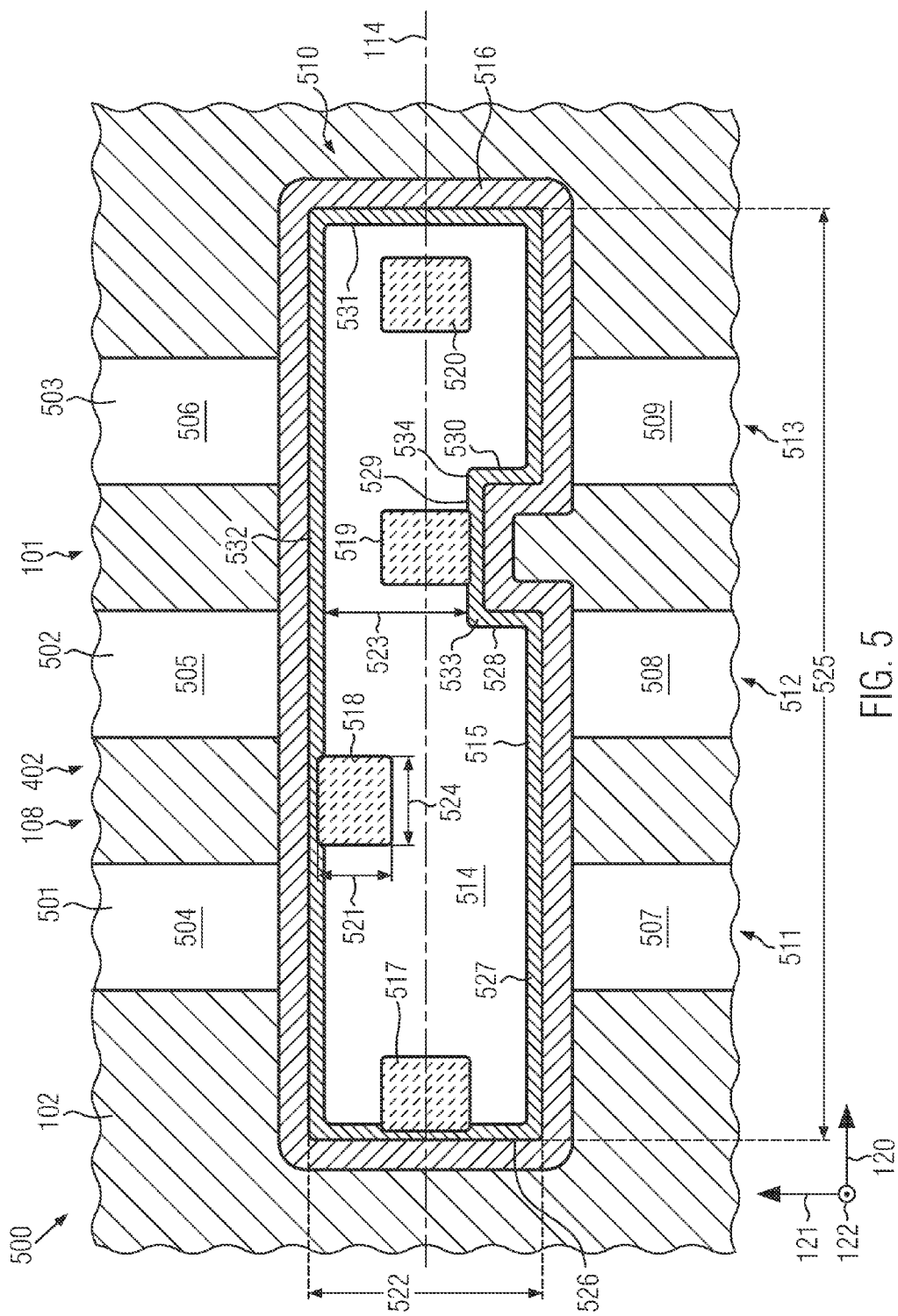
FIG. 5 shows a schematic top view of a semiconductor structure according to an embodiment.

FIG. 5 shows a schematic top view of a semiconductor structure 500 according to an embodiment. For convenience, in FIGS. 1*a* to 4*c* on the one hand, and in FIG. 5 on the other hand, like reference numerals have sometimes been used for denoting like components. Components denoted by like reference numerals may have corresponding features, and corresponding methods may be used for the formation thereof.

The semiconductor structure 500 includes an active region 501 of a transistor element 511, an active region 502 of a transistor element 512 and an active region 503 of a transistor element 513. The active regions 501, 502, 503 may be formed in a semiconductor material of a substrate 101. The semiconductor structure 500 may further include a trench isolation structure 102. The trench isolation structure 102 may provide electrical isolation between the active regions 501, 502, 503 and between transistor elements 511, 512, 513, and other circuit elements formed at the substrate 101.

The semiconductor structure 500 further includes an electrically conductive structure 510 that forms a common gate electrode of each of the transistor elements 511, 512, 513. Below the electrically conductive structure 510, channel regions of the transistor elements 511, 512, 513 may be provided, and a gate insulation layer may be provided between the channel regions and the electrically conductive structure 510. Features of the gate insulation layers may correspond to those of the gate insulation layer 107 described above with reference to FIGS. 1*a* to 4*c*. The electrically conductive structure 510 may be annularly enclosed by a sidewall spacer structure 516, which may have features corresponding to those of the sidewall spacer structures 109, 414 described above. The electrically conductive structure 510 may include an inner portion 514 that may be formed of aluminum and an outer layer 515 that may be formed of a metallic material other than aluminum. In particular, the outer layer 515 may include a gate workfunction adjustment material for the transistor elements 511, 512, 513. Depending on the type of the transistor elements 511, 512, 513, the outer layer 515 may include an N-gate workfunction adjustment material similar to the second metallic layer 307 described above or a P-gate workfunction adjustment material similar to the first metallic layer 205.

As can be seen in the top view of FIG. 5, the outer layer 515 of the electrically conductive structure 510 may include portions that are arranged lateral to the inner portion 514. Further portions of the outer layer 515 of the electrically conductive structure 510 may be arranged below the inner portion 514, similar to the arrangement of a portion of the second metallic layer 307 below the second aluminum layer 308 in the replacement gate electrode 401 described above. In particular, portions of the outer layer 515 of the electrically conductive structure 510 may be provided over the gate insulation layers of the transistor elements 511, 512, 513, and they may have an influence on the channel regions.

The semiconductor structure 500 further includes contacts 517, 518, 519, 520 that are arranged over the electrically conductive structure 510. The contacts 517, 518, 519, 520 may be provided in the form of contact holes formed in an interlayer dielectric 402, which is shown transparently in FIG. 5, and filled with an electrically conductive material such as, for example, tungsten. A further interlayer dielectric 108, which is also shown transparently in FIG. 5, may be provided adjacent the electrically conductive structure 510.

In FIG. 5, reference numeral 521 denotes an extension of the contact 518 in a direction of coordinate axis 121, and reference numeral 524 denotes an extension of the contact 518 in a direction of coordinate axis 120. The coordinate axes 120, 121 are perpendicular to a direction of coordinate axis 122, which is substantially parallel to a thickness direction of the substrate 101. The contacts 517, 519, 520 may have dimensions corresponding to those of the contact 518.

Reference numeral 522 denotes an extension of portions of the electrically conductive structure over the active regions 501, 502, 503 in the direction of the coordinate axis 121, which correspond to a channel length direction of the transistor elements 511, 512, 513. In some embodiments, the electrically conductive structure 510 may include portions over the trench isolation structure 102 which have an extension 523 in the direction of the coordinate axis 121 that is smaller than the extension 522. The extension 521 of the contacts 517, 518, 519, 520 in the direction of the coordinate axis 521 may be smaller than both the extension 522 and the extension 523. The extension 524 of the contacts 517, 518, 519, 520 in the direction of the coordinate axis 520 may be smaller than an extension 525 of the electrically conductive structure 510 in the direction of the coordinate axis 120.

Generally, for any direction that is perpendicular to the coordinate axis 122 that corresponds to the direction of the thickness direction of the substrate 101, the extension of the contacts 517, 518, 519, 520 in the direction may be smaller than the minimum extension of the electrically conductive structure 510 in the direction.

The electrically conductive structure 510 may have edges 526, 527, 531, 532. In embodiments wherein the electrically conductive structure 510 includes portions having a smaller extension 523 in the direction of coordinate axis 121 than other portions of the electrically conductive structure 510, the edge 527 may have portions 528, 529, 530 that define internal corners 533, 534 of the edge 527. In particular, internal corner 533 is between portions 528 and 529 of the edge 527, and internal corner 534 is between portions 529, 530 of the edge 527.

Each of the contacts 517, 518, 519 is arranged such that it contacts the outer layer 515 of the electrically conductive structure 510. For this purpose, contact 517 is arranged closer to the edge 526 than to the edge 531 that is opposite to the edge 526, wherein there is a portion of the contact 517 over the portion of the outer layer 515 at the edge 526. Contact 518 is arranged closer to the edge 532 than to the edge 527 opposite to the edge 532, wherein there is a portion of the contact 518 over the portion of the outer layer 515 at the edge 532. Contact 519 is arranged between the internal corners 533, 534 so that there is a portion of the contact 519 over the portion of the outer layer 515 at the portion 529 of the edge 527 that is shifted inwardly relative to the rest of the edge 527. In addition to contacts 517, 518, 519 that are arranged such that they contact the outer layer 515 of the electrically conductive structure 510, there may be contact 520, which is arranged such that it contacts only the inner portion 514 of the electrically conductive structure.

The electrically conductive structure 510 may have a generally rectangular shape, wherein the term "generally rectangular" is intended to include portions that deviate from an ideal rectangular shape such as, for example, portions 528, 529, 530 of the edge 527, as well as a certain degree of rounding of the electrically conductive structure 510 that might be caused by properties of processes such as photolithography that are employed in the manufacturing of the electrically conductive structure 510.

For forming the semiconductor structure 500, a dummy feature having a shape corresponding to the shape of the electrically conductive structure 510 may be provided. After forming sidewall spacer structure 516, performing implantation processes for doping the source regions 504, 505, 506 and the drain regions 507, 508, 509 and forming interlayer dielectric 108 adjacent the dummy feature, the dummy feature may be removed, and layers of the materials of the outer layer 515 and the inner portion 514 of the electrically conductive structure 510 may be deposited over the semiconductor structure 500. Then, portions of these layers outside the recess that was obtained by the removal of the dummy feature may be removed by means of a chemical mechanical polishing process. Thereafter, interlayer dielectric 402 may be deposited over the semiconductor structure 500, and contact holes filled with an electrically conductive material may be formed for providing the contacts 517, 518, 519, 520.

The present disclosure is not limited to embodiments wherein the contacts 517, 518, 519, 520 are arranged as described above with reference to FIG. 5. In other embodiments, contact 520, which does not contact the outer layer 515 of the electrically conductive structure 510, may be omitted, and a contact that contacts the outer layer 515 of the electrically conductive structure 510 may be provided instead.

Furthermore, the present disclosure is not limited to embodiments wherein the electrically conductive structure 510 has an edge with internal corners 533, 534 such as edge 527 described above with reference to FIG. 5. In other embodiments, the electrically conductive structure 510 may have a substantially constant extension in the direction of the coordinate axis 121 along the entire extension of the electrically conductive structure 510 in the direction of the coordinate axis 120.

Furthermore, the present disclosure is not limited to embodiments wherein there are four contacts 517, 518, 519, 520 as shown in FIG. 5. In other embodiments, a greater or smaller number of contacts may be provided.

Figure 6A:
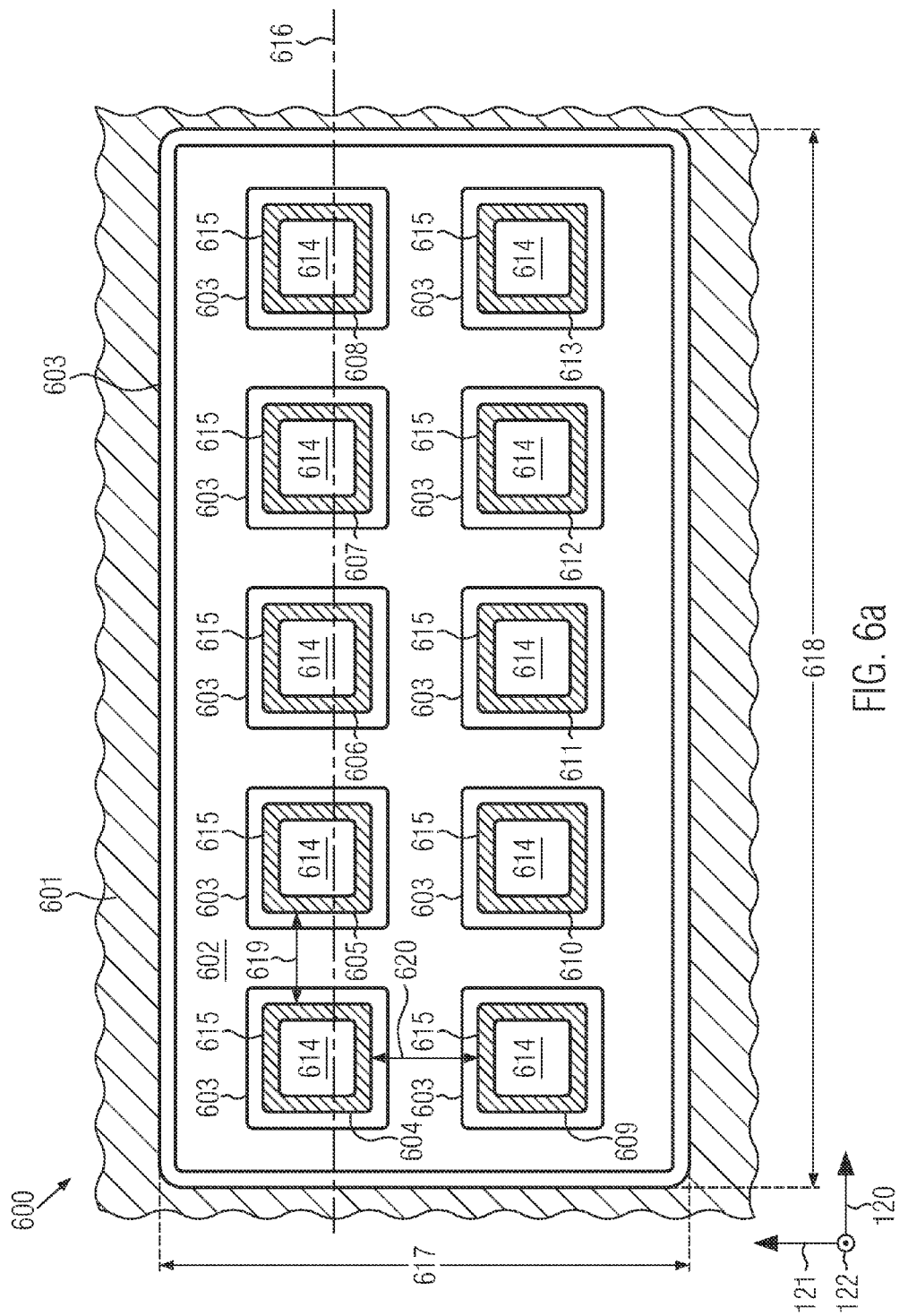
FIG. 6a shows a schematic top view of a semiconductor structure according to an embodiment.
Figure 6B:
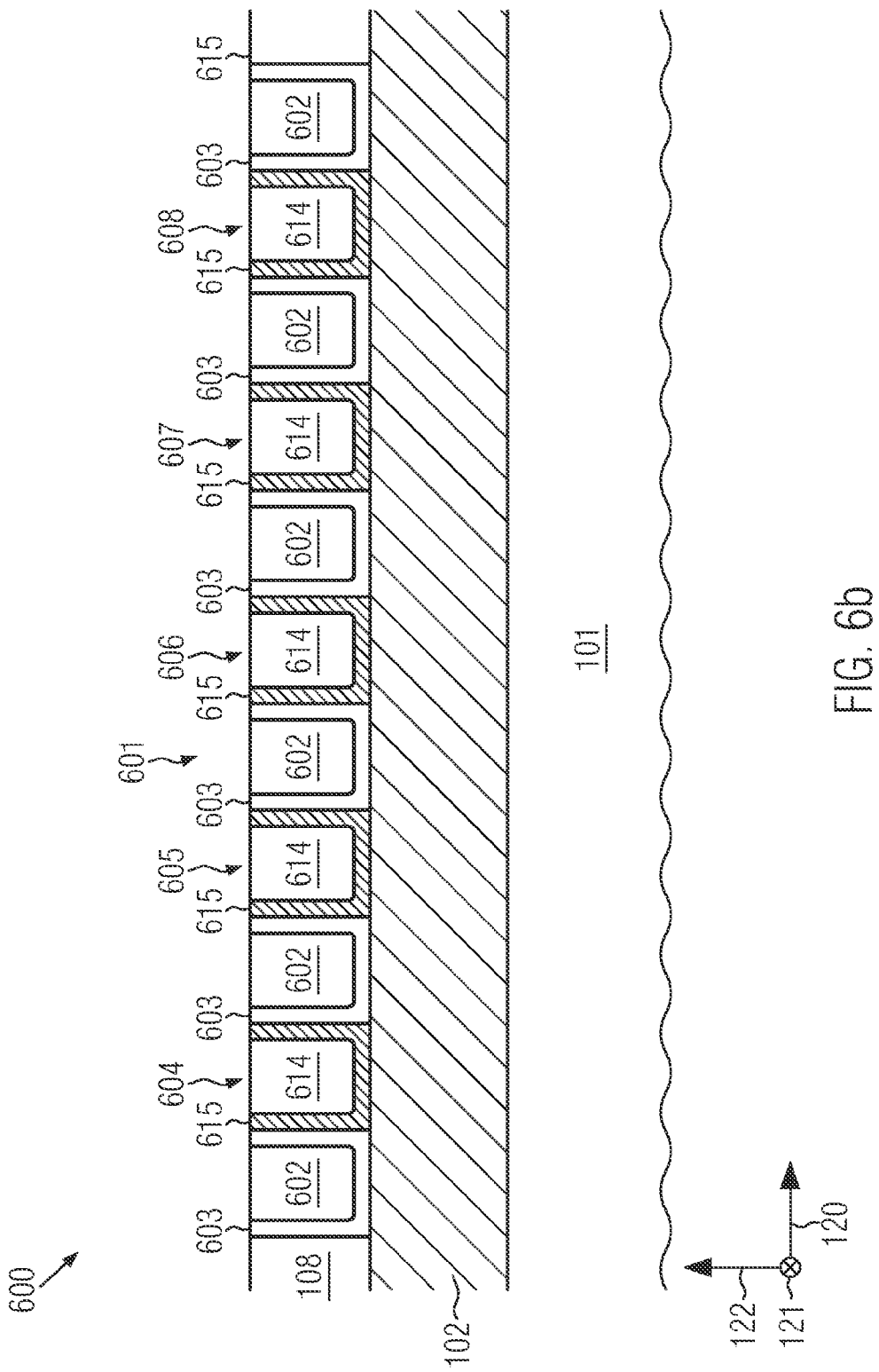

FIG. 6a shows a schematic top view of a semiconductor structure 600 according to an embodiment. A schematic cross-sectional view of the semiconductor structure 600 along dashed line 616 shown in FIG. 6a is shown in FIG. 6b. For convenience, in FIGS. 1a to 5 on the one hand, and in FIGS. 6a and 6b on the other hand, like reference numerals have sometimes been used to denote like components. Components having like reference numerals may have corresponding features, and corresponding methods may be used for the formation thereof.

The semiconductor structure 600 includes a substrate 101. At the substrate 101, a trench isolation structure 102 is provided. The semiconductor structure 600 further includes an electrically conductive structure 601 arranged over the trench isolation structure 102. An extension 618 of the electrically conductive structure 601 in a direction of a coordinate axis 120 that is perpendicular to a coordinate axis 122 that is substantially parallel to a thickness direction of the substrate 101 may be greater than about 2 μm. For example, the extension 618 may be in a range from about 2-50 μm. Furthermore, an extension 617 of the electrically conductive structure 601 in the direction of coordinate axis 121 that is perpendicular to both the coordinate axis 120 and the coordinate axis 122 may be about 2 μm or more. For example, the extension 617 may be in a range from about 2-50 μm.

In some embodiments, the electrically conductive structure 601 may provide a photolithography overlay mark. For example, the electrically conductive structure 601 may form a photolithography overlay mark or a part of a photolithography overlay mark. In other embodiments, the electrically conductive structure 601 may provide a circuit element of an analog electric circuit. For example, the electrically conductive structure 601 may form a circuit element of an analog electric circuit or form a part of the circuit element of the analog electric circuit. The circuit element of the analog electric circuit may include a capacitor and/or an inductivity.

The electrically conductive structure 601 includes an inner portion 602, which may be formed of aluminum, and an outer layer 603 that is formed of a metallic material other than aluminum. For example, the metallic material of the outer layer 603 of the electrically conductive structure 601 may include a gate workfunction adjustment material that is used in transistors of a first type, for example N-channel transistors, that are provided in other portions of the semiconductor structure 600 for adjusting the workfunction of the gate electrodes thereof. In some embodiments, the outer layer 603 of the electrically conductive structure 601 may include lanthanum, lanthanum nitride and/or titanium nitride.

The semiconductor structure 600 further includes a plurality of electrically conductive pillars 604 to 613. Each of the electrically conductive pillars 604 to 613 includes an inner portion 614 and an outer layer 615. The inner portion 614 of the electrically conductive pillars 604 to 613 may include aluminum. The outer layer 615 of the electrically conductive pillars 604 to 613 may include a metallic material that is different from the metallic material of the outer layer 603 of the electrically conductive structure 601 and different from the aluminum of the inner portion 614. The metallic material of the outer layer 615 of the electrically conductive pillars 604 to 613 may be a gate workfunction adjustment material that is provided in gate electrodes of transistors of a second type, for example P-channel transistors, that are provided in other parts of the semiconductor structure 600. In some embodiments, the outer layer 615 of the electrically conductive pillars 604 to 613 may include tantalum nitride and/or titanium nitride.

The outer layer 603 of the electrically conductive structure 601 may be provided below the inner portion 602 of the electrically conductive structure 601 and lateral to the inner portion 602 of the electrically conductive structure 601, as can be seen, in particular, in the cross-sectional view of FIG. 6b.

The outer layer 615 of the electrically conductive pillars 604 to 613 may be provided below the inner portions 614 of the electrically conductive pillars 604 to 613, and lateral to the inner portions 614 of the electrically conductive pillars 604 to 613. At the sidewalls of the electrically conductive pillars 604 to 613, the outer layer 603 of the electrically conductive structure 601 may contact the outer layer 615 of the electrically conductive pillars 604 to 613.

A spacing 619 between the electrically conductive pillars 604 to 613 in the direction of the coordinate axis 120 and a spacing 620 between the electrically conductive pillars 604 to 613 in the direction of the coordinate axis 121 may be about 2 μm or less. For example, the spacings 619, 620 may be in a range from about 50 nm to about 2 μm.

For forming the electrically conductive structure 601 and the electrically conductive pillars 604 to 613, techniques as described above with reference to FIGS. 1a to 4c may be employed. In particular, a dummy feature having dimensions corresponding to the dimensions 617, 618 of the electrically conductive structure 601 may be provided. Then, interlayer dielectric 108 may be deposited over the semiconductor structure 600, and a chemical mechanical polishing process may be performed for exposing the dummy feature and for obtaining a substantially planar surface of the semiconductor structure 600. Then, portions of the dummy feature at the locations of the electrically conductive pillars 604 to 613 may be removed for forming recesses in the semiconductor structure 600. A layer of the metallic material of the outer layer 615 of the electrically conductive pillars 604 to 613 may be deposited over the semiconductor structure 600. Then, a layer of the material of the inner portion 614 of the electrically conductive pillars 604 to 613 may be deposited over the semiconductor structure 600. Then, portions of the deposited layers outside the recesses may be removed. Thereafter, the rest of the dummy feature may be removed, and layers of the materials of the outer layer 603 of the electrically conductive structure 601 and the inner portion 602 of the electrically conductive structure 601 may be deposited. Then, portions of these layers outside the recess that was formed by the removal of the rest of the dummy feature may be removed by means of a chemical mechanical polishing process. In the chemical mechanical polishing process, the presence of electrically conductive pillars 604 to 613 may reduce a likelihood of dishing occurring.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A semiconductor structure comprising:
   a substrate;
   a first transistor and a second transistor, said first transistor being one of a P-channel transistor and an N-channel transistor, said second transistor being the other of a P-channel transistor and an N-channel transistor;
   at least one electrically conductive pillar positioned above said substrate and comprising a first inner portion and a first outer layer that is provided below said first inner portion and lateral to first said inner portion; and
   a first gate electrode structure for said first transistor positioned above said substrate and comprising a second inner portion and a second outer layer that is provided below said second inner portion and lateral to said second inner portion, wherein said first gate electrode structure annularly encloses each of said at least one electrically conductive pillar, said first outer layer contacts said second outer layer and said first outer layer and said second outer layer are formed of different metallic materials.

2. The semiconductor structure of claim 1, wherein said second outer layer comprises a first metallic gate workfunction adjustment material adapted for adjusting a workfunction of said first gate electrode of said first transistor.

3. The semiconductor structure of claim 2, further comprising a second gate electrode for said second transistor, wherein said first outer layer comprises a second metallic gate workfunction adjustment material adapted for adjusting a workfunction of said second gate electrode of said second transistor.

4. The semiconductor structure of claim 1, further comprising:
   an interlayer dielectric positioned above said first gate electrode structure; and
   at least one contact formed in said interlayer dielectric, each of said at least one contact providing an electrical connection to one of said at least one electrically conductive pillar.

5. The semiconductor structure of claim 4, wherein said at least one contact contacts said first outer layer of said electrically conductive pillar.

6. The semiconductor structure of claim 1, wherein said first transistor comprises an active region comprising a source region, a drain region and a channel region between said source region and said drain region, wherein said first gate electrode structure extends across said channel region along a channel width direction that is perpendicular to a channel length direction from said source region to said drain region, said first gate electrode structure further extends over an isolation structure adjacent said active region and said at least one electrically conductive pillar is positioned vertically above said isolation structure.

7. The semiconductor structure of claim 6, wherein said at least one electrically conductive pillar comprises two electrically conductive pillars that are each positioned vertically above said isolation structure on opposite sides of said active region.

8. The semiconductor structure of claim 1, wherein said first inner portion and said second inner portion comprise aluminum.

9. The semiconductor structure of claim 1, wherein said semiconductor structure further comprises;
   a P-channel transistor comprising a metallic P-gate workfunction adjustment material; and
   an N-channel transistor comprising a metallic N-gate workfunction adjustment material, wherein said first outer layer of said at least one electrically conductive pillar is formed of one of said P-gate workfunction adjustment material and said N-gate workfunction adjustment material and said second outer layer of said first gate electrode structure is formed of the other of said P-gate workfunction adjustment material and said N-gate workfunction adjustment material.

10. The semiconductor structure of claim 1, wherein said at least one electrically conductive pillar comprises a plurality of electrically conductive pillars, wherein a spacing between adjacent ones of said plurality of electrically conductive pillars being about 2 µm or less.

11. The semiconductor structure of claim 1, wherein said first gate electrode structure has a generally rectangular shape.

12. The semiconductor structure of claim 4, wherein, for any direction perpendicular to a thickness direction of said substrate, an extension of said at least one contact in said direction is smaller than a minimum extension of said first gate electrode structure in said direction.

13. The semiconductor structure of claim 12, wherein said at least one contact is arranged such that it contacts said first and second outer layers.

14. A semiconductor structure comprising:
   a substrate;
   a first transistor and a second transistor, said first transistor being one of a P-channel transistor and an N-channel transistor, said second transistor being the other of a P-channel transistor and an N-channel transistor;
   at least one electrically conductive pillar positioned above said substrate and comprising a first inner portion and a first outer layer that is provided below said first inner portion and lateral to first said inner portion;
   a first gate electrode structure for said first transistor positioned above said substrate and comprising a second inner portion and a second outer layer that is provided below said second inner portion and lateral to said second inner portion, wherein said first gate electrode structure annularly encloses each of said at least one electrically conductive pillar, said first outer layer contacts said second outer layer, said first outer layer and said second outer layer are formed of different metallic materials and said first and second inner portions comprise aluminum;
   an interlayer dielectric positioned above said first gate electrode structure; and
   at least one contact formed in said interlayer dielectric, each of said at least one contact providing an electrical connection to one of said at least one electrically conductive pillar, wherein each of said at least one contact conductively contacts said first and second outer layers.

15. The semiconductor structure of claim 14, wherein said second outer layer comprises a first metallic gate workfunction adjustment material adapted for adjusting a workfunction of said first gate electrode of said first transistor.

16. The semiconductor structure of claim 15, further comprising a second gate electrode for said second transistor, wherein said first outer layer comprises a second metallic gate workfunction adjustment material adapted for adjusting a workfunction of said second gate electrode of said second transistor.

17. The semiconductor structure of claim 14, wherein said first transistor comprises an active region comprising a source region, a drain region and a channel region between said source region and said drain region, wherein said first gate electrode structure extends across said channel region along a channel width direction that is perpendicular to a channel length direction from said source region to said drain region, said first gate electrode structure further extends over an isolation structure adjacent said active region and said at least one electrically conductive pillar is positioned vertically above said isolation structure.

18. The semiconductor structure of claim 17, wherein said at least one electrically conductive pillar comprises two electrically conductive pillars that are each positioned vertically above said isolation structure on opposite sides of said active region.

19. The semiconductor structure of claim 14, wherein said semiconductor structure further comprises;
   a P-channel transistor comprising a metallic P-gate workfunction adjustment material; and
   an N-channel transistor comprising a metallic N-gate workfunction adjustment material, wherein said first outer layer of said at least one electrically conductive pillar is formed of one of said P-gate workfunction adjustment material and said N-gate workfunction adjustment material and said second outer layer of said first gate electrode structure is formed of the other of said P-gate workfunction adjustment material and said N-gate workfunction adjustment material.

20. The semiconductor structure of claim 14, wherein, for any direction perpendicular to a thickness direction of said substrate, an extension of said at least one contact in said direction is smaller than a minimum extension of said first gate electrode structure in said direction.

* * * * *